United States Patent
Noda

(10) Patent No.: US 7,626,520 B2
(45) Date of Patent: Dec. 1, 2009

(54) ENCODING METHOD, ENCODING APPARATUS, DECODING METHOD, AND DECODING APPARATUS

(75) Inventor: Makoto Noda, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/042,862

(22) Filed: Mar. 5, 2008

(65) Prior Publication Data

US 2008/0218388 A1 Sep. 11, 2008

(30) Foreign Application Priority Data

Mar. 5, 2007 (JP) ............................. 2007-054172

(51) Int. Cl.
*H03M 5/00* (2006.01)
(52) U.S. Cl. .......................................... 341/58; 341/50
(58) Field of Classification Search ............... 341/50–70
See application file for complete search history.

(56) References Cited

U.S. PATENT DOCUMENTS

| | | | |
|---|---|---|---|
| 5,731,768 A * | 3/1998 | Tsang ........................... | 341/59 |
| 6,011,497 A * | 1/2000 | Tsang et al. .................... | 341/59 |
| 6,400,288 B1 * | 6/2002 | Fredrickson et al. ........... | 341/58 |
| 6,526,530 B1 | 2/2003 | Nazari et al. | |
| 6,557,124 B1 | 4/2003 | Cideciyan et al. | |
| 6,581,184 B1 | 6/2003 | Saeki et al. | |
| 6,829,306 B2 * | 12/2004 | Immink et al. ............... | 375/253 |
| 6,989,775 B2 * | 1/2006 | Noda et al. .................... | 341/58 |
| 7,006,017 B2 * | 2/2006 | Noda et al. .................... | 341/58 |
| 7,158,059 B2 * | 1/2007 | Noda et al. .................... | 341/58 |
| 7,193,540 B2 * | 3/2007 | Noda et al. .................... | 341/58 |
| 2005/0174262 A1 | 8/2005 | Lee et al. | |

OTHER PUBLICATIONS

J. Moon and B. Brickner, "Maximum transition Run Codes for Data Storage Systems," IEEE Transactions on Magnetics, vol. 32, No. 5, pp. 3992-3994, Sep. 1996.
E. Soljanin, "Application of Distance Enhancing Codes," IEEE Trans. Magn., vol. 37, No. 2, pp. 762-767, Mar. 2001.
T. Nishiya, K. Tsukano, T. Hirai, S. Mita and T. Nara, "Rate 16/17 Maximum Transition Run (3f;11) Code on an EEPRML Channel with an Error-Correcting Postprocessor," IEEE Trans. Magn., vol. 35, No. 5, pp. 4378-4386, Sep. 1999.
T. Nishiya et al., "Rate 16/17 Maximum Transtition Run (3;11) Code on an EEPRML Channel with an Error-Correcting Postprocessor," IEEE Transactions on Magnetics, vol. 35, pp. 4378-4386, 1999.
M. Leung et al., "Reduced Complexity Sequence Detection for High-Order Partial Response Channels," Journal on Selected Areas in Communications, vol. 19, pp. 649-661, 2001.

* cited by examiner

*Primary Examiner*—Lam T Mai
(74) *Attorney, Agent, or Firm*—K&L Gates LLP

(57) ABSTRACT

An encoding method is disclosed for use with an encoding apparatus for carrying out variable-length conversion encoding involving a look-ahead operation of at least either one information word or one code word upon encoding. The encoding method includes the step of performing conversion encoding in such a manner as to permit decoding of encoded words in units of a code word.

16 Claims, 11 Drawing Sheets

FIG. 2

| MTR CONSTRAINT | SHANNON CAPACITY |
|---|---|
| 1 | 0.6942 |
| 2 | 0.8791 |
| 3 | 0.9468 |
| 4 | 0.9752 |
| 5 | 0.9881 |

FIG. 3

| RULE NO. | BEFORE CONVERSION | AFTER CONVERSION |
|---|---|---|
| 1 | 0011,1100 | 0111,0100 |
| 2 | 0011,1101 | 0111,0101 |
| 3 | 1011,1100 | 1010,1110 |
| 4 | 1011,1101 | 1000,1110 |
| 5 | 0000,0000 | 0010,1100 |
| 6 | 0000,0001 | 0000,1110 |
| 7 | 0000,0010 | 0111,0010 |
| 8 | 0000,0011 | 0111,0110 |
| 9 | 1000,0000 | 0111,0000 |
| 10 | 0100,0000 | 0100,1110 |
| 11 | 1100,0000 | 0110,1110 |

FIG.5

| MAXIMUM RUN CONSTRAINT | SHANNON CAPACITY ||
|---|---|---|
| | MTR=3 | MTR=4 |
| 1 | 0.5515 | 0.6174 |
| 2 | 0.7947 | 0.8376 |
| 3 | 0.8791 | 0.9146 |
| 4 | 0.9146 | 0.9468 |
| 5 | 0.9306 | 0.9614 |
| 6 | 0.9388 | 0.9684 |
| 7 | 0.9427 | 0.9718 |
| 8 | 0.9447 | 0.9735 |

FIG.7

| 16-BIT INFORMATION WORD | 17-BIT TEMPORARY CODE WORD |
|---|---|
| 0000000000000000 | 00000100000010001 |
| 0000000000000001 | 00000100000010010 |
| 0000000000000010 | 00000100000010011 |
| 0000000000000011 | 00000100000010100 |
| 0000000000000100 | 00000100000010101 |
| 0000000000000101 | 00000100000010110 |
| 0000000000000110 | 00000100000011010 |
| 0000000000000111 | 00000100000011011 |

FIG.8

| RULE NO. | BEFORE CONVERSION | AFTER CONVERSION |
|---|---|---|
| 1 | 0000,0 | 0111,0 |
| 2 | 0,0000 | 0,1110 |

FIG.11

| RULE NO. | BEFORE CONVERSION | AFTEER CONVERSION |
|---|---|---|
| 1 | ··· 0111, ··· | ··· 0000, ··· |
| 2 | ···, 1110 ··· | ···, 0000 ··· |

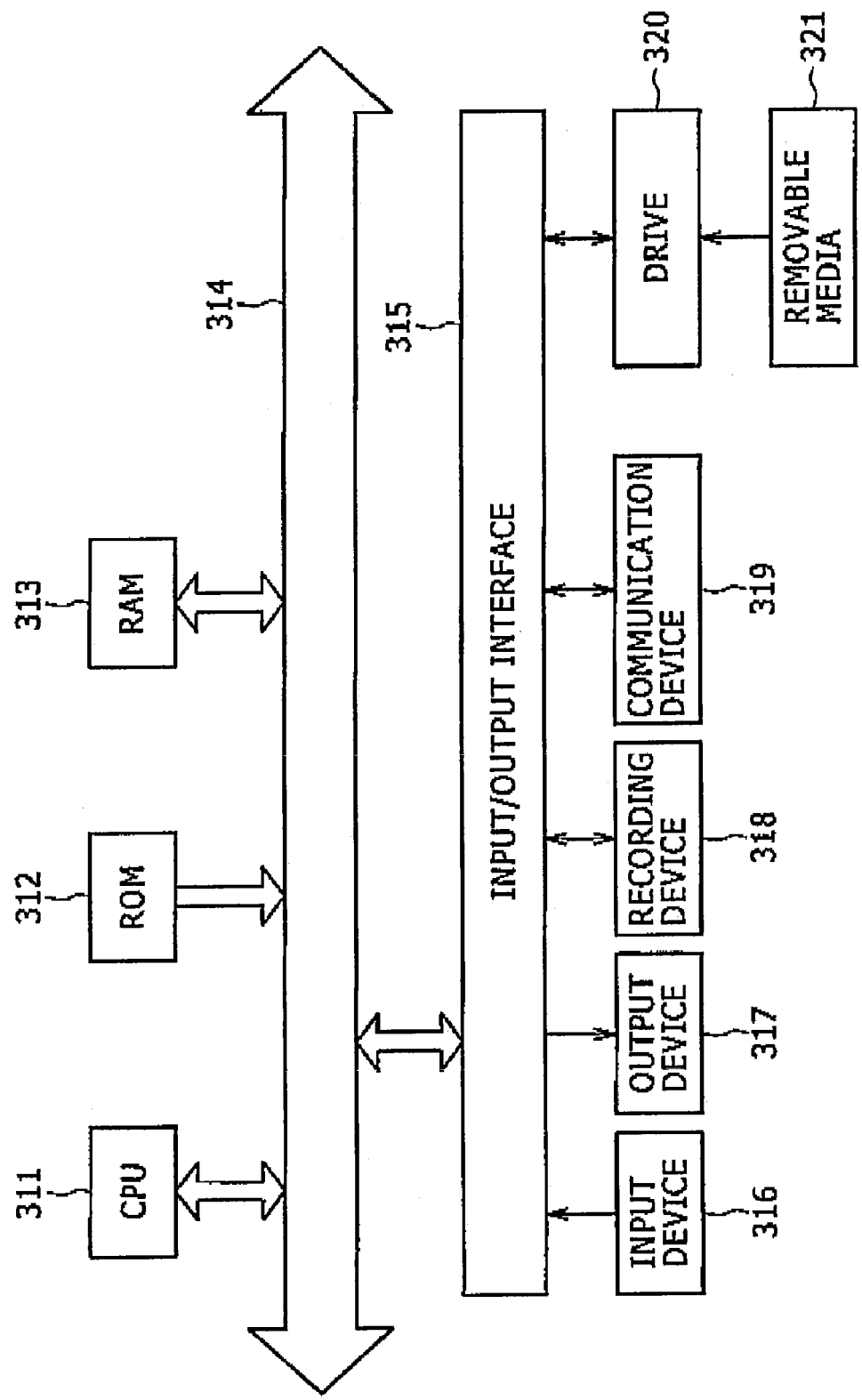

ENCODING METHOD, ENCODING APPARATUS, DECODING METHOD, AND DECODING APPARATUS

CROSS REFERENCES TO RELATED APPLICATIONS

The present application to Japanese Patent Application JP 2007-054172 filed in the Japan Patent Office on Mar. 5, 2007, the entire contents of which being incorporated herein by reference.

BACKGROUND

The present application relates to an encoding method, an encoding apparatus, a decoding method, and a decoding apparatus. More particularly, the invention relates to an encoding method, in encoding apparatus, a decoding method, and a decoding apparatus for reducing the bit error rate (BER) of transmitted information and the probability of undetected errors in the information.

Many recording and reproducing apparatuses and communication apparatuses have been designed to reduce the bit error rate of digitally transmitted information typically by encoding input information sequences before they are transmitted. FIG. 1 is a block diagram showing a configuration of a typical recording and reproduction system 1 made up of a recording apparatus 11 and a reproducing apparatus 12.

In FIG. 1, an information sequence from the user side (i.e., input information sequence) is input to an encoding section 21 and encoded at a k/n ratio into all encoded sequence (where, "k" stands for an information word length and "n" for a code word length, and k/n is called a code rate). For encoding purposes, a plurality of encoding methods are often used in combination including an encryption code, an error-correcting code, and an RLL (run-length limited) code.

The encoded sequence is input to a recording section 22. In turn, the recording section 22 records the sequence to a recording medium, not shown, using an optical pickup, a magnetic head or other suitable means. Recording signals from the recording section 22 are input to the reproducing apparatus 12.

More specifically, the recording signals from the recording section 22 are input to a reproducing section 31 of the reproducing apparatus 12. In turn, the reproducing section 31 converts the signals from the recording medium, not shown, to analog reproduction signals using an analog optical pickup, a magnetic head or other suitable means. The analog reproduction signals are equalized by an analog equalizer, not shown, into a predetermined target equalization characteristic before being converted periodically into digital reproduction signals by an A/D (analog/digital) converting section 32. The A/D converting section 32 includes a phase locked-loop circuit, not shown.

The digital reproduction signals are converted by a code detecting section 33 into a detected code sequence or a posterior probability information sequence that is input to a decoding section 34. The decoding section 34 decodes the input sequence at an n/k ratio into a detected information sequence.

If the equalization by the analog equalizer or the like is not sufficient, there may be disposed a digital equalizer between the A/D converting section 32 and the code detecting section 33. In recent years, it has become customary to use a soft-decision detector such as a Viterbi detector in the code detecting section 33. If the decoding section 34 adopts iterative decoding, then a posterior probability detector may be used in the code detecting section 33 in some cases.

Apart from the typical recording and reproduction system 1 composed of the recording apparatus 11 and reproducing apparatus 12 as shown in FIG. 1, there may be provided a transmitting and receiving system made up of a transmitting apparatus and a receiving apparatus. The transmitting apparatus may include a transmitting section replacing the recording section 22 and the receiving apparatus may have a receiving section replacing the reproducing section 31. In this transmitting and receiving system, the encoding section 21, A/D converting section 32, code detecting section 33, and decoding section 34 still carry out the same processes as in the recording and reproduction system 1.

Various encoding methods are considered for use by the encoding section 21 of the recording apparatus 11 in FIG. 1. For storage system purposes, an RLL code and an error-correcting code are generally used in combination.

The Reed-Solomon code has long been utilized as an error-correcting code. In recent years, the so-called low-density parity-check code has come into general use as a highly effective error-correcting code.

As a variation of the RLL code, there is a so-called (d, k) RLL code whereby the maximum run length of 0's between 1's is limited to "k" and the minimum run length of 0's between 1's is limited to "d" in an encoded sequence before NRZI (non-return to zero invert) modulation. In NRZI modulation, the polarity of recording or transmission signals is inverted on 1's and not inverted on 0's.

What is known as an MTR (maximum transition run) code is a code whereby the maximum run length of 1's is set at least to two and is finite in an encoded sequence before NRZI modulation. Any code whereby the maximum run length of 1's is set to one is the same as minimum run-length limited codes that have long been known, so that that code generally is not called an MTR code.

Techniques related to the MTR code are disclosed illustratively by a non-patent document "IEEE Trans. Magn. 32, p. 3992, 1996" by J. Moon and B. Bricker (called the Non-Patent Document 1 hereunder), and U.S. Pat. No. 5,859,601, January 1999, by J. Moon and B. Bricker (called the Patent Document 1 hereunder). According to these documents, it is possible to constitute a code with a code rate of 7/8 if the maximum run length of the code (MTR=2) code is at least eight.

The expression "maximum transition run (MTR)" indicating the maximum number of continuous 1's in an encoded sequence was first used in the above-cited Non-Patent Document 1. However, codes whereby the maximum number of continuous 1's is set to a finite number had been known before publication of that document. A major feature of the MTR code is that by limiting the maximum transition run of 1's to a small number, the code allows a trellis of received signal detectors with their partial responses equalized to remove or reduce encoded sequences of small square Euclidean distances, thereby affording a coding gain to the system in use. In the case of codes whereby the maximum transition run of 1's is limited but is set to a large number, the coding gain tends to be very small. For this reason, any code whereby the maximum transition run of 1's is limited approximately to between two and four for coding gain enhancement is often called an MTR code.

The performance of MTR codes whereby the maximum transition run of 1's is limited to between two and four is illustratively discussed in detail in a non-patent document "Application of Distance Enhancing Codes," IEEE Trans.

Magn., Vo. 37, No. 2, pp. 762-767, March 2001 (called the Non-Patent Document 2 hereunder).

If the signal-to-noise ratio (SNR) of received signals is assumed to be constant, then the gain for the code detector in use is greater the larger the maximum transition run of 1's. Generally, stricter MTR constraints entail lower code rates that can be attained as well as deteriorated SNR's. Thus optimal MTR constraints for the code of interest are correlated with the signal transmission characteristic of the system in use.

FIG. 2 is a tabular view showing how the Shannon capacity of a given code is dependent on MTR constraints where encoded sequences are not limited by maximum run lengths. A Shannon capacity signifies a theoretical maximum code rate that may be attained by a code subject to constraints. That is, it is theoretically possible to design a code with its code rate lower than the applicable Shannon capacity. It should be noted that the example in FIG. 2 has no consideration for known methods whereby the MTR constraints are set in a time-varying structure in which even-numbered and odd-numbered bits occur, say, every two bits and every three bits respectively.

Where the Shannon capacities of codes are dependent on MTR constraints as shown in FIG. 2 and where encoded sequences are not subject to maximum run length limits, the Shannon capacity is illustratively 0.6942 for MTR=1, 0.8791 for MTR=2, 0.9468 for MTR=3, 0.9752 for MTR=4, and 0.9881 for MTR=5.

Most storage systems and communication systems perform their internal processes in units of bytes (i.e., 8 bits). It follows that these systems find it convenient if the information word length of the RLL code is a multiple of eight. If codes of which the information word length is a multiple of one byte are assumed, then it is possible to design a code of 8/10 conversion for MTR=2 (code rate: 0.8), a code of 16/17 conversion for MTR=3 (code rate: 0.9411 . . . ), and a code of 32/33 conversion for MTR=4 (code rate: (0.9696 . . . ). The code for actual use by a system, however, demands limiting the maximum run length of encoded sequences at the same time. Thus depending on the maximum run length limit applicable to the code in use, that code may or may not be designed for a high code rate under the same MTR constraints.

A (0, 11)16/17 RLL code is a code (MTR=3), whereby the maximum run length of encoded sequences is limited to 11, as disclosed illustratively by T. Nishiya, K. Tsukano, T. Hirai. S. Mita and T. Nara in a non-patent document "Rate 16/17 Maximum Transition Run (3; 11) Code on an EEPRML Channel with an Error-Correcting Postprocessor," IEEE Trans. Magn. Vol. 35, No. 5, pp. 4378-4386, September 1999 (called the Non-Patent Document 3 hereunder).

The 16/17 code disclosed in the Non-Patent Document 3 above is a variable-length code whereby information words are converted to temporary words in accordance With a basic code conversion table before the temporary code words are converted to code words according to a violation code conversion table involving code word look-ahead operations.

Variable-length codes generally offer higher code rates and, given the same code rate, work as an efficient code scheme with shorter-code lengths than fixed-length codes that do not demand code word look-ahead operations.

What follows is a description of how the 16/17 code disclosed in the Non-Patent Document 3 above works as an encoding method. Sixteen-bit information words are converted to 17-bit temporary code words in accordance with a basic code conversion table so that the maximum run length of 0's is 10 and the maximum run length of 1's is 3 per temporary code word and that the maximum run length of 1's at the beginning and at the end of each temporary code word is 2. There exist 65,546 17-bit sequences that meet these constraints. As many as $2^{16}$ (=65,546) 17-bit sequences are selected as the temporary code words and included in the basic code conversion table. Some of these temporary code words can violate the constraints of MTR=3 and k=11 at a connection between two code words. In such cases, the words are encoded according to a violation code conversion table.

FIG. 3 is a tabular view showing an eight-bit violation code conversion table disclosed by the Non-Patent Document 3 above for use at connections between codes. In FIG. 3, each comma (,) indicates the boundary between two consecutive code words.

In the violation code conversion table of FIG. 3, rule number 1 indicates that if the last 4 bits of a temporary code word 1 are "0011" and the first 4 bits of a temporary code word 2 immediately following the temporary code word 1 are "1100," then the last 4 bits of the temporary code word 1 are converted to "0111" and the first 4 bits of the temporary code word 2 are converted to "0100" as a definitive code word each.

Likewise, rule number 2 indicates that if the last 4 bits of the temporary code word 1 are "0011" and the first 4 bits of the temporary code 2 are "1101" these bits are converted to "0111" and "0101" respectively; rule number 3 indicates that if the last 4 bits of the temporary code word 1 are "1011" and the first 4 bits of the temporary code 2 are "1100," these bits are converted to "1010" and "1110" respectively; rule number 4 indicates that if the last 4 bits of the temporary code word 1 are "0111" and the first 4 bits of the temporary code 2 are "1101" these bits are converted to "1000" and "1110" respectively; and rule number 5 indicates that if the last 4 bits of the temporary code word 1 are "0000" and the first 4 bits of the temporary code 2 are "0000," these bits are converted to "0010" and "1100" respectively.

Similarly, rule number 6 indicates that if the last 4 bits of the temporary code word 1 are "0000" and the first 4 bits of the temporary code 2 are "0001," these bits are converted to "0000" and "1110" respectively; rule number 7 indicates that if the last 4 bits of the temporary code word 1 are "0000" and the first 4 bits of the temporary code 2 are "0010," these bits are converted to "0111" and "0010" respectively; rule number 8 indicates that if the last 4 bits of the temporary code word 1 are "0000" and the first 4 bits of the temporary code 2 are "0011," these bits are converted to "0111" and "0110" respectively; rule number 9 indicates that if the last 4 bits of the temporary code word 1 are "1000" and the first 4 bits of the temporary code 2 are "0000," these bits are converted to "0111," and "0000" respectively; rule number 10 indicates that if the last 4 bits of the temporary code word 1 are "0100" and the first 4 bits of the temporary code 2 are "0000," these bits are convened to "0100" and "1110" respectively; and rule number 11 indicates that if the last 4 bits of the temporary code word 1 are "1100" and the first 4 bits of the temporary code 2 are "0000," these bits are converted to "0110" and "1110" respectively.

According to the Non-Patent Document 3, as outlined above, any code word violating the applicable constraints at a connection between two code words is encoded in keeping with the violation code conversion table of FIG. 3.

The variable-length code is easy to design as a code with a high code rate. On the other hand, the variable-length code tends to entail a maximum error propagation length that is longer than that of a fixed-length code having the same information word length as that code.

The maximum error propagation length refers to a maximum length over which a one-bit error occurring in an encoded sequence propagates to an information sequence.

Generally, the maximum error propagation length in effect upon decoding of a fixed-length code is equal to the length of one information word; the maximum error propagation length of a variable-length code typically equals two information words or longer. The longer the information words constituting a maximum error propagation length, the more adversely affected the system in use. Illustratively, the 16/17 code disclosed by the Non-Patent Document 3 above has a maximum error propagation length of two information words at decoding (i.e., 32 bits long).

The shorter the error propagation length of the code, the better. If a code is designed for fixed-length conversion encoding with its information word length kept constant then the error propagation length involved can be shortened. In this case, however, the code rate can often deteriorate because a longer code word length is demanded to obtain desired code constraints. While it is preferable to minimize the error propagation length at decoding of a variable-length code, there has been no encoding method whereby the error propagation length of the variable-length code is limited to one information word or less.

It may also be noted that in the 16/17 code disclosed by the Non-Patent Document 3 above, the maximum transition run (MTR) of 1's is a relatively short three whereas the MTR of 0's (maximum run length) is a relatively long 11.

In order to stabilize the system as a whole including PLL (phase-locked loop) circuitry, it is preferable generally to minimize the maximum run length of the RLL code. For example, if the system adopts an equalization method involving null DC (direct current) components, the maximum run length of the code is proportional to the maximum run length of 0's in expected reproduction signal values. It follows that the larger the maximum run length, the more unstable the PLL circuitry can become in systems with high frequency deviations. In general, magnetic tape systems tend to have higher frequency deviations in reproduced signals than disk systems such as hard disk drives and optical disk systems. In particular, magnetic tape systems employing a rotary transformer arrangement tend to have difficulty in recording low-frequency signals because of the low-frequency cutoff characteristic of the rotary transformer. Thus a prolonged maximum run length of the code will likely cause the magnetic tape system to leave portions of the preceding records undeleted from the magnetic tape during overwrite operations, giving rise to an elevated overwrite noise.

For the reasons outlined above, it may be preferred to utilize an RLL code with its maximum run length made as short as possible depending on the type of the system in use. However, there has been no known encoding method of an RLL code having MTR constraints such that the code rate of encoding is equal to or greater than 16/17 and the maximum run length of the code is 10 or less.

For example, the Non-Patent Document 1 above discusses what kinds of maximum run length constraints are possible for the code (MTR=2) at certain code rates but makes no reference to the codes of MTR=3 and MTR=4. On the other hand, the Non-Patent Document 2 above describes the codes of MTR=3 and MTR=4 but makes no reference to the maximum run lengths of these codes.

That is, according to the techniques proposed so far as outlined above, it is not necessarily clear how the maximum run length can be limited at specific code rates for the codes of MTR=3 and MTR=4.

SUMMARY

The present application has been made in view of the above circumstances and provides arrangements such as to provide efficient, variable-length RLL coding and to shorten the error propagation length involved during decoding.

According to one embodiment thereof there is provided an encoding method for use with an encoding apparatus for carrying out variable-length conversion encoding involving a look-ahead operation of at least either one information word or one code word upon encoding, the encoding method including the step of performing conversion encoding in such a manner as to permit decoding of encoded words in units of a code word.

Preferably, the encoding method according to an embodiment may further include the steps of: converting an information word to a temporary code word in accordance with a basic code conversion table which has information words associated with temporary code words therein; and converting the temporary code word to a code word in accordance with a violation code conversion table constituted by code conversion rules which are prohibited by the basic code conversion table and which are used solely to convert either the temporary code word in effect at present or the temporary code word acquired earlier by the look-ahead operation.

Preferably, the encoding method according to an embodiment may further include the steps of: converting, in accordance with the basic code conversion table, each information word to a temporary code word such that the maximum transition run of one bits at the beginning and at the end of the temporary code word is limited to two and that the maximum transition run of zero bits at the beginning and at the end of the temporary code word is limited to between four and ten; and converting, in accordance with the violation code conversion table if the maximum transition run of zero bits is at least seven at a connection between two temporary code words, selectively one of the two temporary code words of which the transition run of zero bits either at the beginning or at the end is at least four, in such a manner that either the first or the last three bits of the selected temporary code word are converted from zero bits to one bits.

Preferably, the code rate of the encoding may be 16/17 for the encoding method in an embodiment.

Alternatively, the code rate of the encoding may be 24/25 for the encoding method in an embodiment.

According to another embodiment, there is provided an encoding apparatus for carrying out variable-length conversion encoding involving a look-ahead operation of at least either one information word or one code word upon encoding; the encoding apparatus including: first converting means for converting, in accordance with a basic code conversion table which has information words associated with temporary code words therein, each information word to a temporary code word such that the maximum transition run of one bits at the beginning and at the end of the temporary code word is limited to two and that the maximum transition run of zero bits at the beginning and at the end of the temporary code word is limited to between four and ten; and second converting means for converting, in accordance with a violation code conversion table if the maximum transition run of zero bits is at least seven at a connection between two temporary code words, selectively one of the two temporary code words of which the transition run of zero bits either at the beginning or at the end is at least four, in such a manner that either the first or the last three bits of the selected temporary code word are converted from zero bits to one bits, the violation code conversion table being constituted by code conversion rules which are prohibited by the basic code conversion table and which are used solely to convert either the temporary code word in effect at present or the temporary code word acquired earlier by the look-ahead operation.

Preferably, the code rate of the encoding may be 16/17 for the encoding apparatus of the invention.

Alternatively, the code rate of the encoding may be 24/25 for the encoding apparatus of the invention.

Where the encoding method or encoding apparatus embodying the present invention as outlined above is in use information words are encoded in such a manner that they may be subsequently decoded in units of a code word.

According to a further embodiment, there is provided a decoding method for use With a decoding apparatus for decoding code words encoded through variable-length conversion encoding involving a look-ahead operation of at least either one information word or one code word upon encoding, the decoding method including the step of decoding the code words that were encoded in such a manner as to permit decoding thereof in units of a code word.

Preferably, the decoding method according to an embodiment of the present invention may further include the steps of: converting a code word to a temporary code word in accordance with a violation code conversion table constituted by code conversion rules which are prohibited by a basic code conversion table having information words associated with temporary code words therein and which permit conversion in units of a code word; and converting the temporary code word to an information word in accordance with the basic rule conversion table.

Preferably, the decoding method according to an embodiment may further include the steps of: if the transition run of one bits either at the beginning or at the end of the code word is three, then converting either the first or the last three bits of the code word from one bits to zero bits in accordance with the violation code conversion table; and converting the temporary code word to the information word in accordance with the basic code conversion table whereby the maximum transition run of one bits at the beginning and at the end of the temporary code word is limited to two and whereby the maximum transition run of zero bits at the beginning and at the end of the temporary code word is limited to between four and ten.

Preferably, the code rate of the encoding may be 16/17 for the decoding method in an embodiment.

Alternatively, the code rate of the encoding may, be 24/25 for the decoding method in an embodiment.

According to a further embodiment, there is provided a decoding apparatus for decoding code words encoded through variable-length conversion encoding involving a look-ahead operation of at least either one information word or one code word upon encoding, the decoding apparatus including: first decoding means for, if the transition run of one bits either at the beginning or at the end of the code word is three, converting either the first or the last three bits of the code word from one bits to zero bits in accordance with a violation code conversion table constituted by code conversion rules which are prohibited be a basic code conversion table having information words associated with temporary code words therein and which permit conversion in units of a code word; and second decoding means for converting a temporary code word to an information word in accordance with the basic code conversion table whereby the maximum transition run of one bits at the beginning and at the end of the temporary, code word is limited to two and whereby the maximum transition run of zero hits at the beginning and at the end of the temporary code word is limited to between four and ten.

Preferably, the code rate of the encoding may be 16/17 for the decoding apparatus in an embodiment.

Alternatively, the code rate of the encoding may be 24/25 for the decoding apparatus in an embodiment.

Where the decoding method or decoding apparatus embodying the present invention as outlined above is in use, the code words that ere encoded in such a manner as to be subsequently decoded in units of a code word are decoded.

According to the above-outlined encoding method and encoding apparatus according to an embodiment, variable-length conversion is carried out in such a manner that error propagation length in effect upon decoding is limited to a maximum of one word. This makes it possible to implement efficient RLL coding while minimizing the error propagation length involved during decoding.

Also according to the inventive encoding method and encoding apparatus, it is possible to implement RLL coding with a shortened maximum run length of MTR=4.

According to the above-outlined decoding method and decoding apparatus according to an embodiment, variable-length conversion is performed in such a manner that error propagation length in effect upon decoding is limited to a maximum of one word. This makes it possible to minimize the error propagation length involved during decoding.

Additional features and advantages are described herein, and will be apparent from the following Detailed Description and the figures.

BRIEF DESCRIPTION OF THE FIGURES

FIG. 2 is a tabular view showing how the Shannon capacity of a given code is dependent on MTR constraints where encoded sequences are not limited by maximum run lengths;

FIG. 3 is a tabular view showing a typical violation code conversion table.

FIG. 5 is a tabular view showing how the Shannon capacity of a given code is dependent on MTR constraints where encoded sequences are limited by maximum run lengths;

FIG. 7 is a tabular view showing a typical basic code conversion table;

FIG. 8 is a tabular view showing a typical violation code conversion table;

FIG. 11 is a tabular view showing another typical violation code conversion table;

FIG. 13 is a block diagram showing a typical structure of a personal computer.

DETAILED DESCRIPTION

Figure 1:
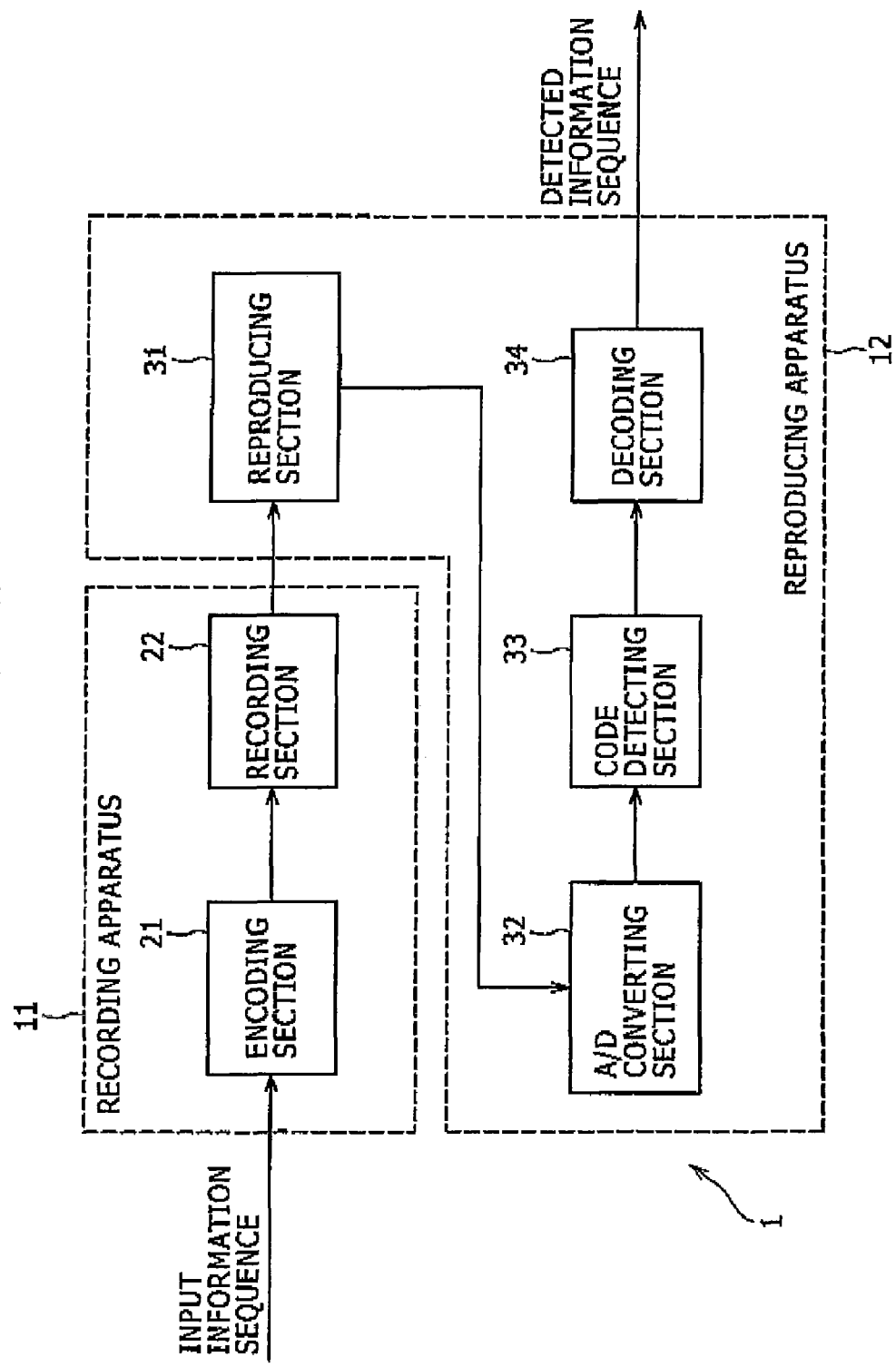
FIG. 1 is a block diagram showing the configuration of a typical recording and reproduction system.

The present application will be described below in greater detail with reference to the drawings according to an embodiment.

An embodiment is an encoding method for use with an encoding apparatus (e.g., recording apparatus 111 in FIG. 4) for carrying out variable-length conversion encoding involving a look-ahead operation of at least either one information Word or one code word upon encoding, the encoding method including the step of performing (i.e., in steps S11 and S12 of FIG. 9) conversion encoding in such a manner as to permit decoding of encoded words in units of a code word.

Preferably, the encoding method according to an embodiment may further include the steps of: converting (e.g., in step S11 of FIG. 9) an information word to a temporary, code word in accordance with a basic code conversion table (e.g., basic code conversion table in FIG. 7) which has information words associated with temporary code words therein; and converting (e.g., in step S12 of FIG. 9) the temporary, code word to a code word in accordance with a violation code conversion table (e.g., violation code conversion table in FIG. 8) constituted by, code conversion rules which are prohibited by the basic code conversion table and which are used solely to convert either the temporary code word in effect at present or the temporary code word acquired earlier by the look-ahead operation.

Preferably, the encoding method according to an embodiment may further include the steps of: converting (e.g., in step S11 of FIG. 9), in accordance with the basic code conversion table, each information word to a temporary, code word such that the maximum transition run of one bits at the beginning and at the end of the temporary code word is limited to two and that the maximum transition run of zero bits at the beginning and at the end of the temporary code word is limited to between four and ten; and converting (e.g., in step S12 of FIG. 9), in accordance with the violation code conversion table if the maximum transition run of zero bits is at least seven at a connection between two temporary code words, selectively one of the two temporary code words of which the transition run of zero bits either at the beginning or at the end is at least four, in such a manner that either the first or the last three bits of the selected temporary code word are converted from zero bits to one bits.

Another embodiment is an encoding apparatus (e.g., recording apparatus 111 in FIG. 4) for carrying out variable-length conversion encoding involving a look-ahead operation of at least either one information word or one code word upon encoding, the encoding apparatus including: first converting means (e.g., basic code converting section 141 in FIG. 4) for converting, in accordance with a basic code conversion table (e.g., basic code conversion table in FIG. 7) which has information words associated with temporary code words therein, each information word to a temporary code word such that the maximum transition run of one bits at the beginning and at the end of the temporary code word is limited to two and that the maximum transition run of zero bits at the beginning and at the end of the temporary code word is limited to between four and ten; and second converting means (e.g., violation code converting section 142 in FIG. 4) for converting, in accordance with a violation code conversion table (e.g., violation code conversion table in FIG. 8) if the maximum transition run of zero bits is at least seven at a connection between two temporary code words, selectively one of the two temporary code words of which the transition run of zero bits either at the beginning or at the end is at least four, in such a manner that either the first or the last three bits of the selected temporary code word are converted from zero bits to one bits, the violation code conversion table being constituted by code conversion rules which are prohibited bad the basic code conversion table and which are used solely to convert either the temporary code word in effect at present or the temporary, code word acquired earlier by the look-ahead operation.

A further embodiment is a decoding method for use with a decoding apparatus (e.g., decoding apparatus 112 in FIG. 4) for decoding code words encoded through variable-length conversion encoding involving a look-ahead operation of at least either one information word or one code word upon encoding, the decoding method including the step of decoding (e.g., in steps S31 and S32 of FIG. 10) the code words that were encoded in such a manner as to permit decoding thereof in units of a code word.

Preferably, the decoding method according to an embodiment may further include the steps of: converting (e.g., in step S31 of FIG. 10) a code word to a temporary, code word in accordance with a violation code conversion table (e.g., violation code conversion table in FIG. 11) constituted by code conversion rules which are prohibited by a basic code conversion table (e.g., basic code conversion table in FIG. 7) having information words associated with temporary code words therein and which permit conversion in units of a code word; and converting (e.g., in step S32 of FIG. 10) the temporary code word to an information word in accordance with the basic rule conversion table.

Preferably, the decoding method according to an embodiment may further include the steps of: if the transition run of one bits either at the beginning or at the end of the code word is three, then converting (e.g., in step S31 of FIG. 10) either the first or the last three bits of the code word from one bits to zero bits in accordance with the violation code conversion table; and converting (e.g., in step S32 of FIG. 10) the temporary code word to the information word in accordance with the basic code conversion table whereby the maximum transition run of one bits at the beginning and at the end of the temporary code word is limited to two and whereby the maximum transition run of zero bits at the beginning and at the end of the temporary code word is limited to between four and ten.

A further embodiment is a decoding apparatus (e.g., reproducing apparatus 112 in FIG. 4) for decoding code words encoded through variable-length conversion encoding involving a look-ahead operation of at least either one information word or one code word upon encoding, the decoding apparatus including: first decoding means (e.g., violation code converting section 151 in FIG. 4) for, if the transition run of one bits either at the beginning or at the end of the code word is three, converting either the first or the last three bits of the code word from one bits to zero bits in accordance with a violation code conversion table (e.g., violation code conversion table in FIG. 11) constituted by code conversion rules which are prohibited by a basic code conversion table (e.g., basic code conversion table in FIG. 7) having information words associated with temporary code words therein and which permit conversion in units of a code word; and second decoding means (e.g., basic code converting section 152 in FIG. 4) for converting a temporary code word to an information word in accordance with the basic code conversion table whereby the maximum transition run of one bits at the beginning and at the end of the temporary code word is limited to two and whereby the maximum transition run of zero bits at the beginning and at the end of the temporary code word is limited to between four and ten.

Figure 4:
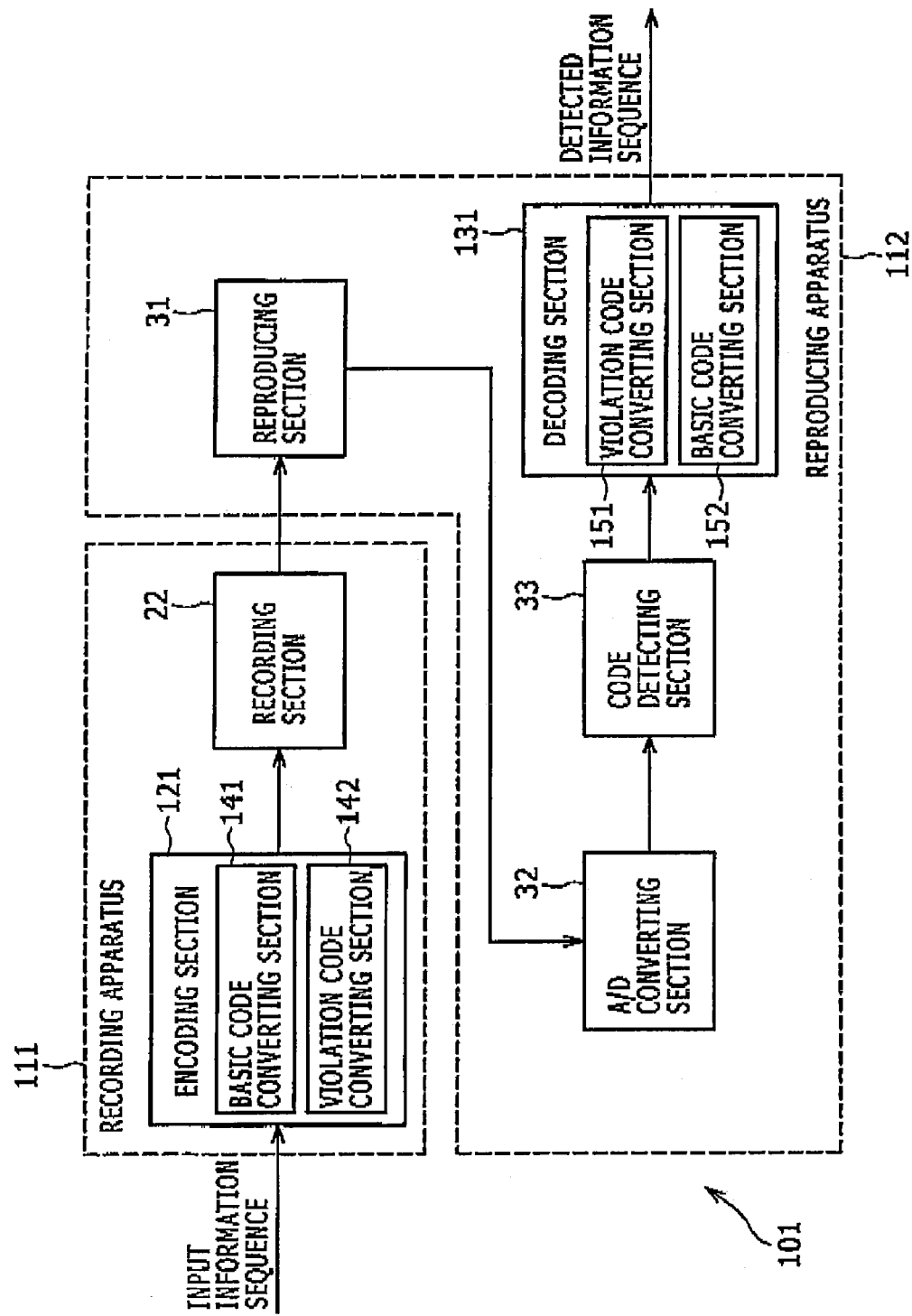
FIG. 4 is a block diagram showing a typical configuration of a recording and reproduction system to which the present invention is applied.

The preferred embodiments will now be described in more detail with reference to the accompanying drawings. FIG. 4 is a block diagram showing a typical configuration of a recording and reproduction system 101 to which the present invention is applied. Illustratively, the recording and reproduction system 101 may be a storage system made up of a recording apparatus 111 and a reproducing apparatus 112.

Those components of the recording and reproduction system 101 in FIG. 4 which have their functionally identical counterparts in the ordinary recording and reproduction system 1 in FIG. 1 are designated by like reference numerals, and their description will be omitted where redundant. The recording apparatus 111 in FIG. 4 is structurally the same as the recording apparatus 11 in FIG. 1 except that an encoding section 121 of the recording apparatus 111 replaces the encoding section 21 of the recording apparatus 11. The reproducing apparatus 112 in FIG. 4 is structurally the same as the reproducing apparatus 12 in FIG. 1 except that a decoding section 131 of the reproducing apparatus 112 replaces the decoding section 34 of the reproducing apparatus 12.

As in the ordinary setup explained above with reference to FIG. 1, if the equalization by an analog equalizer turns out to be insufficient for the decoding section 131 in FIG. 4, a digital equalizer may be disposed interposingly between the A/D converting section 32 and the code detecting section 33.

In the recording apparatus 111 the encoding section 121 encodes input information sequences illustratively using an RLL code and an error-correcting code. The encoded sequences thus obtained are supplied to the recording section 22.

The encoding section 121 is structured to include a basic code converting section 141 and a violation code converting section 142. The basic code converting section 141 is used to convert information words to temporary code words in accordance with a basic code conversion table, and the violation code converting section 142 is employed to convert the temporary code words to code words in keeping with a violation code conversion table. The two code conversion tables will be discussed later in detail.

In the reproducing apparatus 112, the decoding section 131 decodes detected code sequences supplied by the code detecting section 33 following conversion of digital reproduction signals. The decoding process yields detected information sequences to be output.

The decoding section 131 is structured to include a violation code converting section 151 and a basic code converting section 152. The violation code converting section 151 is used to convert code words to temporary code words in accordance with the violation code conversion table, and the basic code converting section 152 is employed to convert the temporary code words to information words in keeping with the basic code conversion table. The two tables will be discussed later in more detail.

Although the recording and reproduction system 101 embodying the present invention is constituted by the recording apparatus 111 and reproducing apparatus 112 which are set up independently of one another, this is not limitative of the invention. Alternatively, the recording and reproduction system 101 may be formed by the recording apparatus 111 and reproducing apparatus 112 which are structured integrally.

The encoding process of the encoding section 121 in FIG. 4 was examined by this applicant in view of the drawbacks of ordinary apparatuses. The examinations involved checking to determine the extent of maximum run lengths (maximum run constraints) applicable to the codes of MTR=3 and MTR=4. The results are listed in the table of FIG. 5.

The table in FIG. 5 shows how the Shannon capacity of the codes for MTR=3 and MTR=4 is dependent on maximum run lengths where encoded sequences are limited thereby. As shown in FIG. 5, where the maximum run length is 1, the Shannon capacitor is 0.5515 for MTR=3 and 0.6174 for MTR=4; where the maximum run length is 2, the Shannon capacity is 0.7947 for MTR=3 and 0.8376 for MTR=4; where the maximum run length is 3, the Shannon capacity is 0.8791 for MTR=3 and 0.9146 for MTR=4; and where the maximum run length is 4, the Shannon capacity is 0.9146 for MTR=3 and 0.9468 for MTR=4.

Likewise, where the maximum run length is 5, the Shannon capacity, is 0.9306 for MTR=3 and 0.9614 for MTR=4; where the maximum run length is 6, the Shannon capacity is 0.9388 for MTR=3 and 0.9684 for MTR=4; where the maximum run length is 7, the Shannon capacity is 0.9427 for MTR=3 and 0.9718 for MTR=4; and where the maximum run length is 8, the Shannon capacity is 0.9447 for MTR=3 and 0.9735 for MTR=4.

According to the table in FIG. 2, as discussed above, it is possible to design the code of 16/17 conversion for MTR=3 (code rate: 0.9411 . . . ) and the code of 32/33 conversion for MTR=4 (code rate: 0.9696 . . . ). On the other hand the table in FIG. 5 indicates that where the maximum run length is 6 or less, the Shannon capacity falls short of 16/17 (0.9411 . . . ) for MTR=3 and 32/33 (0.9696 . . . ) for MTR=4. That means it may be impossible to design codes with these code rates.

In theory, the maximum run length of the 16/17 code for MTR=3 can be reduced to 7, whereas the maximum run length proposed so far for the code of MTR=3 is 11 as described in the Non-Patent Document 3 above. This embodiment of the invention thus involves an encoding method adopting a code of MTR=4 with its maximum run length limited to between 4 and 10.

That is, according to the table in FIG. 5, it is possible to design a code with the code rate of 16/17 (0.9411 . . . ) where the maximum run length is 4 or larger, and a code with the code rate of 24/25 (0.96) where the maximum run length of 5 or larger. It follows that the maximum run length need only be 4 or larger for the code of MTR=4 with the code rate of 16/17. However, this embodiment adopts a code with the maximum run length of 6 so that as many 17-bit sequences as possible can be generated for use as code word candidates. This code will now be described below.

Figure 6:
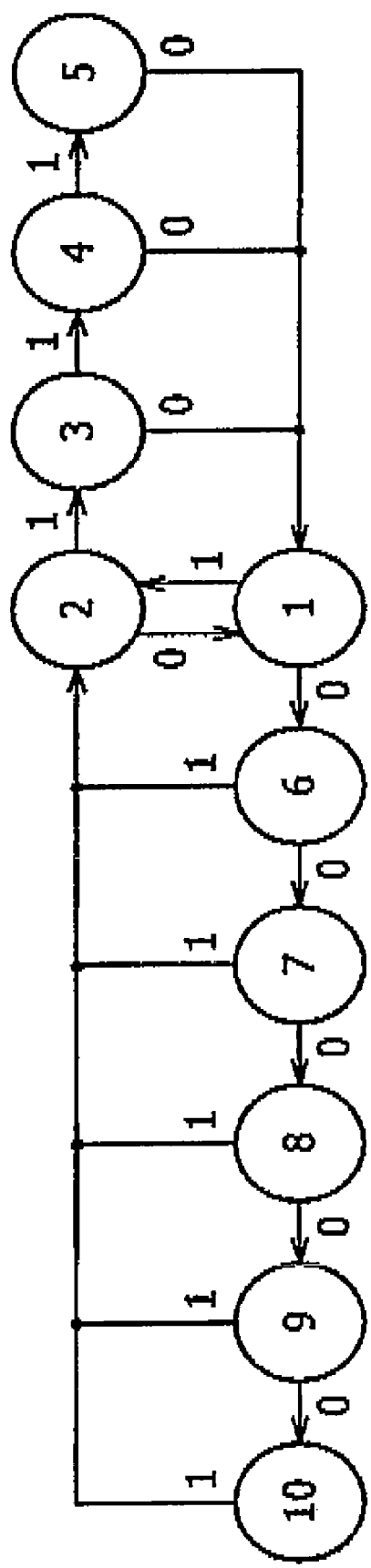
FIG. 6 is a finite state transition diagram showing ten states of an encoded sequence subject to a maximum run length of 6 where MTR=4.

FIG. 6 is a finite-state transition diagram (FSTD) showing ten states of an encoded sequence subject to the maximum run length of 6 where MTR=4. The Shannon capacity of the FSTD in FIG. 6 (in effect when the maximum run length is 6 and MTR=4) is 0.9684, as indicated in the table of FIG. 5. This number is larger than the code rate of 16/17 (0.9411 . . . ), so that a 16/17 code can be implemented.

Although a 16/17 code satisfying the constraints of the FSTD in FIG. 6 can be implemented for fixed-length conversion encoding this embodiment envisages providing a variable-length code. That is because variable-length encoding offers manic more 17-bit sequences serving as code word candidates. That in turn makes it easier to design a code of higher performance permitting simpler implementation of code constraints other than the MTR and maximum run length. While the code constraints other than the MTR and maximum run length are supposed to be designed as desired, it is common practice to choose a maximum run length in effect when an encoded sequence following NRZI modulation is observed every other bit.

Consider now a bit sequence in which the maximum transition run of 1's at the beginning and at the end of each code word is limited to 2, the maximum run length of 0's at the beginning and at the end of the code word is limited to 6, the maximum transition run of 1's halfway through the code word is limited to 4, and the maximum run length of 0's halfway though the code word is limited to 6.

As shown in the FSTD of FIG. 6, states 1 through 4 and states 6 through 9 permit output of both 0's and 1's each, whereas state 5 allows output of only 0's and state 10 only 1's. Under these conditions, with the maximum run length of 0's allowed to be 6 (i.e., in the FSTD of FIG. 6, the run length of 0's does not exceed 6), the transition run of 1's is 2 or less at the beginning of each sequence in state 3, and the transition run of 1's is 2 or less at the end of the sequence in state 1, 2, 3, 6, 7, 8, 9, or 10 (states 4 and 5 excluded).

That is, in the FSTD of FIG. 6, there exist a total of 78,943 17-bit sequences each starting in state 3 and ending in state 1, 2, 3, 6, 7, 8, 9, or 10. Of these bit sequences, $2^{16}$ (=65,536) temporary code words are selected.

In other words, the basic code conversion table (encoding table) of FIG. 7 is created illustratively by assigning temporary code words to the corresponding information words using the FSTD of FIG. 6. More specifically, the table in FIG. 7 is a typical basic code conversion table showing the first eight of the 65,536 (=$2^{16}$) information words that are assigned their corresponding temporary code words as per the FSTD in FIG. 6.

In the basic code conversion table of FIG. 7, the left-hand side column shows 16-bit information words and the right-hand side column indicates 16-bit temporary code words corresponding to the 16-bit information words. That is, the basic code conversion table in FIG. 7 associates information words with corresponding temporal code words.

In the basic conversion table of FIG. 7, the topmost line shows that a 16-bit information word "0000000000000000" is converted to a 17-bit temporary code word "00000100000010001"; the next line shows that a 16-bit information word "0000000000000001" is converted to a 17-bit temporary, code word "00000100000010010"; the next line shows that a 16-bit information word "0000000000000010" is converted to a 17-bit temporary code word "00000100000010011"; and the next line shows that a 16-bit information word "0000000000000011" is converted to a 17-bit temporary code word "00000100000010100."

Similarly, the next line shows that a 16-bit information word "0000000000000100" is converted to a 17-bit temporary code word "00000100000010101"; the next line shows that a 16-bit information word "0000000000000101" is converted to a 17-bit temporal code word "00000100000010110"; the next line shows that a 16-bit information word "0000000000000110" is converted to a 17-bit temporary code word "00000100000011010"; and the next line shows that a 16-bit information word "0000000000000111" is converted to a 17-bit temporary code word "00000100000110011."

That is, according to the basic code conversion table of FIG. 7 created based on the FSTD in FIG. 6, the maximum transition run of 1's is limited to 2 at the beginning and at the end of each temporary code word and the maximum run length of 0's is limited to between 4 and 10 at the beginning and at the end of the temporary code word.

It should be noted that the basic code conversion table of FIG. 7 illustratively shows only eight code conversion rules out of the 65,536 code conversion rules that exist. The temporary code words may be assigned to corresponding information code words as desired.

As described, an embodiment converts 16-bit information words successively to 17-bit temporary code words in accordance with the basic code conversion table of FIG. 7. An unmodified usage of the above rules would result in the maximum run length becoming 12 at each connection between two code words. This flaw is circumvented by resorting to the violation code conversion table in FIG. 8 whereby a code word look-ahead operation is performed if the maximum run length of 6 is violated at the connection between two code words.

FIG. 8 shows a typical violation code conversion table applicable to the connections between code words. In the table of FIG. 8, a comma (,) stands for the boundary between two consecutive code words. The violation code conversion table in FIG. 8 need not be applied if the run length of 0's at a connection between two temporary code words is less than the preferred maximum run length.

In the violation code conversion table of FIG. 8, rule number 1 indicates that if the last 4 bits of a temporary code word 1 is "0000" and if the first 1 bit of a temporary code word 2 immediately following the temporary code word 1 is "0," then the last 4 bits of the temporary code word 1 are converted to "0111" and the first 1 bit of the temporary code word 2 is converted to "0" so as to constitute definitive code words.

Likewise, rule number 2 indicates that if the last 1 bit of the temporary code word 1 is "0" and if the first 4 bits of the temporary code word 2 are "0000," then these bits are converted to "0" and "1110," respectively.

If the last 4 bits of the temporary code word 1 are "0000" and the first 4 bits of the temporary code word 2 also turn out to be "0000," that means the violations rules numbers 1 and 2 in FIG. 8 are satisfied at the same time. In such a case, any one of the two rules may take precedence over the other.

That is, according to the violation code conversion table in FIG. 8, if the maximum run length of 0's at a connection between two temporary code words is 7 or larger, then a selection is made of one of the two code words of which the run length of 0's at the beginning or at the end is at least 4. The first or the last three bits of the selected temporary code word are then converted from 0's to 1's. According to the violation code conversion table in FIG. 8, the run length of 0's at a connection between two temporary code words is limited to a maximum of 6.

Below is a description of the violation code conversion table of FIG. 8 for use with this embodiment of the invention. For purpose of simplification and illustration, this violation code conversion table will be compared in characteristics with the ordinarily utilized violation code conversion table shown in FIG. 3.

According to the ordinary violation code conversion table of FIG. 3, two code words making up a connection therebetween are both subject to code conversion as per the listed rules except for four rules Nos. 6, 7, 9 and 10. For this reason, if a one-bit error occurs at a connection between two code words, the error will propagate to both code words. This kind of error propagation across a plurality of code words has been observed quite often with variable-length codes, not just the code disclosed in the above-cited Patent Document 1.

The violation code conversion table of FIG. 8 used by this embodiment has a simpler structure than the violation code conversion table of FIG. 3. The code of interest is subject to a relatively small number of constraints. At any given connection between two code words, only one of the two code words is subject to second code conversion (i.e., violation code conversion). Where the encoding method of this embodiment is utilized, a one-bit error that could take place upon decoding in an encoded sequence results in error propagation Within one code word alone.

That is, the violation code conversion table of FIG. 8 makes it possible to implement variable-length encoding under MTR constraints in such a manner as to reduce the length of error propagation during decoding.

Figure 9:
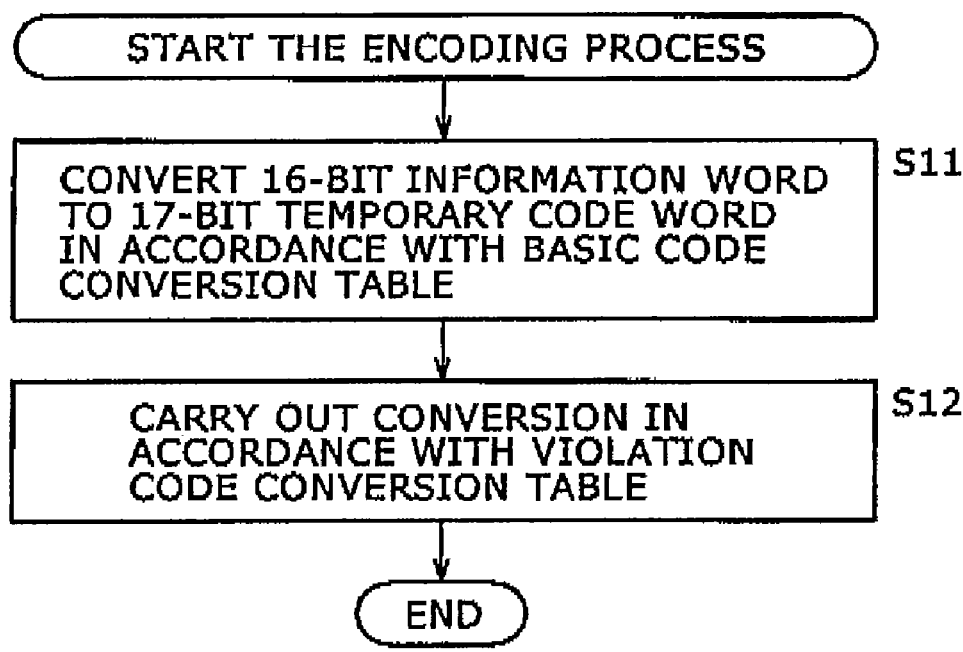
FIG. 9 is a flowchart of steps constituting an encoding process.

Described below in reference to the flowchart of FIG. 9 is an encoding process performed by the encoding section 121 through the use of the violation code conversion table in FIG. 8. The encoding section 121 carries out the process in the flowchart of FIG. 9 illustratively when an information sequence (i.e., information word) is input.

In step S11, the basic code converting section 141 converts a 16-bit information word to a 17-bit temporary code word illustratively in accordance with the basic code conversion table of FIG. 7.

In step S12, the violation code converting section 142 may find that the constraint of the maximum run length being 6 is violated. In such a case, the violation code converting section 142 carries out conversion illustratively in accordance with the violation code conversion table of FIG. 8. This brings the encoding process to an end.

More specifically, if the last 4 bits of the temporary code word 1 are "0000" and the first 1 bit of the temporary code word 2 is "0," then these bits are converted to "0111" and "0," respectively, by the violation code converting section 142 according to the violation code conversion table of FIG. 8. Likewise, if the last 1 bit of the temporary code word 1 is "0" and the first 4 bits of the temporary code word 2 are "0000," then these bits are converted to "0" and "1110," respectively.

If the constraint of the maximum run length being 6 is not found violated, then the violation code converting section 142 does not perform conversion in accordance with the violation code conversion table of FIG. 8.

According to an embodiment, as described above, only one of the two code words constituting a constraint-violating code connection is converted as per the violation code conversion table of FIG. 8. It follows that even if a one-bit error occurs in an encoded sequence being decoded, the length of error propagation is limited to within one code word.

Explained in the foregoing example was the encoding process performed by the encoding section 121 shown in FIG. 4. What follows is a decoding process carried out by the decoding section 131 shown in FIG. 4, whereby encoded sequences are decoded.

Figure 10:
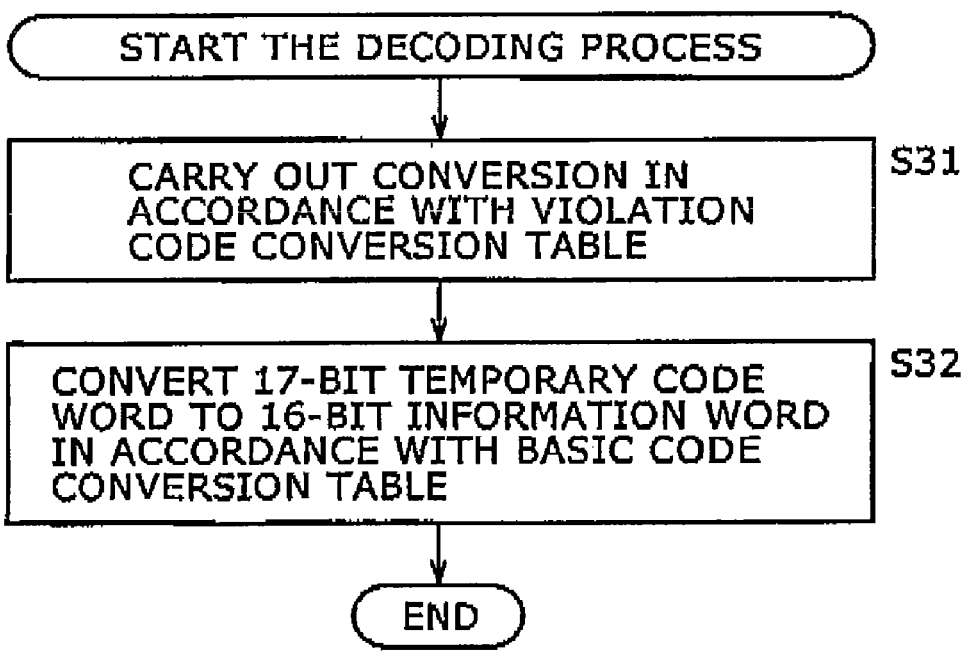
FIG. 10 is a flowchart of steps constituting a decoding process.

FIG. 10 is a flowchart of steps constituting the decoding process performed by the decoding section 131 in FIG. 4. The decoding section 131 carries out this process illustratively when the code detecting section 33 supplies a detected encoded sequence (i.e., code word) derived from the conversion of a digital reproduction signal. In this case, code words are encoded by the encoding section 121 in FIG. 4 in such a manner that the words can be decoded subsequently in units of a code word.

In step S31, the violation code converting section 151 performs conversion in accordance with the violation code conversion table of FIG. 11. FIG. 11 is a tabular view constituting another topical violation code conversion table that may be applied to connections between code words during decoding. In FIG. 11, as in FIG. 8, a comma (,) stands for the boundary between two consecutive code words, and the symbol " . . . " denotes a sequence of zero bits (0's) or one bits (1's).

In the violation code conversion table of FIG. 11, rule number 1 indicates that if the last 4 bits of a code word 1 are "0111," then these bits are converted "0000"; and rule number 2 indicates that if the first 4 bits of the code word 1 are "1110," then these bits are converted to "0000."

That is, according to the violation code conversion table of FIG. 11, if the last 4 bits of the code word 1 are "0111," then the violation code converting section 151 converts these bits to "0000"; if the first four bits of the code word 1 are "1110," then the violation code converting section 151 converts these bits to "0000." In other words, if the maximum transition run of 1's at the beginning and at the end of a code word is 3, then the first or the last 3 bits of the code word in question are converted from 1's to 0's.

In step S32 back in the flowchart of FIG. 10, the basic code converting section 152 converts the 17-bit temporary code word to a 16-bit information word in accordance with the basic code conversion table of FIG. 7. This brings the decoding process to an end.

According to an embodiment, as discussed above, only one of two temporary code words constituting a code connection upon encoding is always converted in keeping With the violation code conversion table of FIG. 8. As a result, a one-bit error that could occur upon decoding in an encoded sequence can be limited to within one code word at the time of conversion based on the violation code conversion table of FIG. 11.

The embodiment described above was shown constituted by the recording and reproduction system 101 made up of the recording apparatus 111 and reproducing apparatus 112, and the violation code conversion tables of FIGS. 8 and 11 were described as applicable to that system. Alternatively, the violation code conversion tables of FIGS. 8 and 11 may also be used by a transmitting and receiving system 201 formed by a transmitting apparatus 211 and a receiving apparatus 212.

Figure 12:
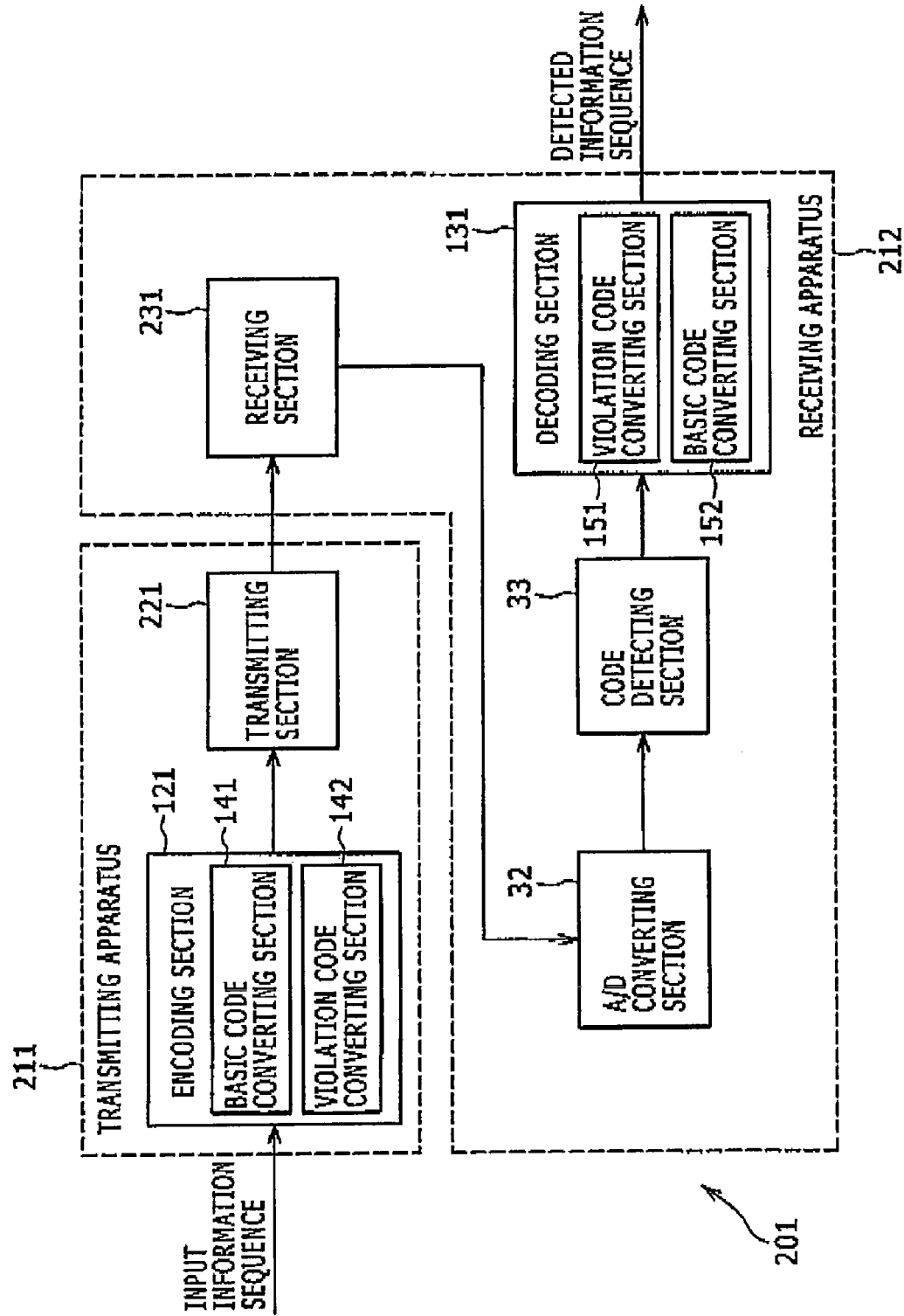
FIG. 12 is a block diagram showing a typical configuration of a transmission and reception system to which the present invention is applied.

FIG. 12 is a block diagram showing a typical configuration of the transmission and reception system 201 to which the present invention is applied. Illustratively, the transmission and reception system 201 is a communication system composed of the transmitting apparatus 211 and receiving apparatus 212.

Those components of the transmission and reception system 201 in FIG. 12 which have their functionally identical counterparts in the recording and reproduction system 101 in FIG. 4 are designated by like reference numerals, and their description will be omitted where redundant. The transmission and reception system 201 in FIG. 12 is structurally the same as the recording and reproduction system 101 in FIG. 4 except that a transmitting section 221 of the transmitting apparatus 211 replaces the recording section 22 of the recording apparatus 111 in FIG. 4 and that a receiving section 231 of the receiving apparatus 212 replaces the reproducing section 31 of the reproducing apparatus 112 in FIG. 4.

In the transmitting apparatus 211, the transmitting section 221 transmits signals corresponding to the encoded sequences coming from the encoding section 121 illustratively via a transmitting antenna into the air. In this case, the transmission and reception system 201 functions as a wireless communication system.

In the receiving apparatus 212, the receiving section 231 receives signals by means of a receiving antenna from the air. The received signals are converted to analog signals before being supplied to the A/D converting section 32.

In the transmission and reception system 201 of the above-outlined structure, as in the recording and reproduction system 101 of FIG. 4, the transmitting apparatus 211 converts only one of two temporary code words constituting each code connection upon encoding in accordance with the violation code conversion table of FIG. 8. Upon decoding, the receiving apparatus 212 decodes the code words that were encoded in such a manner as to be decodable in units of a code word, the decoding being performed according to the violation code conversion table of FIG. 11.

In another example, the transmission and reception system 201 may be structured as a transmitting-receiving apparatus integrally combining the transmitting apparatus 211 with the receiving apparatus 212.

As described, this embodiment offers techniques whereby the length of decoding error propagation is limited to within one code word. A code of MTR=4 may thus be implemented with its maximum run length reduced appreciably. The embodiment can be applied illustratively to encoding apparatuses for encoding codes for use with storage devices and communication equipment.

For example, the inventive techniques may be applied to the encoders used by magnetic recording and reproducing apparatuses such as magnetic disk recording and reproducing apparatus and magnetic tape recording and reproducing apparatus; optical disk apparatuses such as magneto-optical disk recording and reproducing apparatus, phase change optical disk recording and reproducing apparatus, and read-only optical disk reproducing apparatus; and diverse communication equipment including TV sets, mobile phones, and LAN (local area network) setups. The present application when thus implemented, helps reduce the bit error rate (BER) of transmitted information and the probability of undetected errors in the information.

The embodiment was shown applicable to the 16/17 code of MTR=4 with the maximum run length of 6. Alternatively, it is possible to practice the invention by implementing a 24/25 code of MTR=4 with the maximum run length of 6. In this case, with the FSTD of FIG. 6 in use, there exist a total of 16,959,294 25-bit sequences each starting in state 3 and ending in state 1, 2, 3, 6, 7, 8, 9, or 10. Out of these bit sequences, $2^{24}$ (=16,777,216) temporal code words may be selected so as to create a basic code conversion table (for the rate 24/25 code). The subsequent procedures for encoding are the same as those for the 16/17 code above.

Upon encoding, the encoding section 121 converts each 24-bit information word to a 25-bit temporary code word in accordance with the basic code conversion table created for the 24/25 code instead of the basic code conversion table in FIG. 7. The encoding section 121 proceeds to convert the 25-bit temporary code word to a code word according to the violation code conversion table of FIG. 8. Upon decoding, the decoding section 131 decodes each code word into a 25-bit temporary code word in keeping with the violation code conversion table of FIG. 11 and converts the 25-bit temporary code word to a 24-bit information word as per the basic code conversion table provided for the 24/25 code.

The encoding and decoding circuits for use with the 16/17 code or 24/25 code can be easily designed illustratively by resorting to well-known enumerative source coding techniques.

These codes of MTR=4 with reduced maximum run lengths offer lower levels of gain for code detectors than currently known codes of MTR=3. Still, the new codes allow the system in use to maintain a satisfactory, level of detector gain while improving its own robustness.

FIG. 13 is a block diagram showing a typical structure of a personal computer for carrying out the above-described steps and processes using programs. A CPU (central processing unit) 311 performs various processes in keeping with programs that are stored in a ROM (read only memory) 312 or a recording device 318. A RAM (random access memory) 313 accommodates the programs and data being executed or operated on by the CPU 311. The CPU 311, ROM 312, and RAM 313 are interconnected by a bus 314.

An input/output interface 315 is also connected to the CPU 311 via the bus 314. The input/output interface 315 is connected with an input device 316 and an output device 317. The input device 316 is constituted illustratively by microphones and the output device 317 by a display unit and speakers. The CPU 311 carries out diverse processing in response to commands that are input through the input device 316. The result of the processing is sent from the CPU 311 to the output device 317.

The recording device 318 connected to the input/output interface 315 is illustratively composed of a hard disk that may store various programs and data to be handled by the CPU 311. A communication device 319 communicates with an external apparatus by ways of networks such as the Internet and local area networks. Programs may be acquired through the communication device 319 and written to the recording device 318.

Removable media 321 such as a magnetic disk, an optical disk, a magneto-optical disk, or a semiconductor memory may be loaded into a drive 320 connected to the input/output interface 315. The drive 320 drives the loaded medium to acquire programs and/or data therefrom, and transfers the acquired programs or data as demanded to the recording device 318 for storage.

As shown in FIG. 13, the program recording media for accommodating computer-installable, computer-executable programs designed to perform the above-described processes are constituted either by the removable media 321 provided as package media such as magnetic disks (including flexible disks), optical disks (including CD-ROM (compact disc read-only memory) and DVD (digital versatile disc)), magneto-optical disks, or a semiconductor memory; or by the ROM 312 and a hard disk drive making up the recording device 318 having the programs stored thereon temporarily or permanently. The programs may be recorded to the recording media via the communication device 319 such as a router or a modem interfaced with wired or wireless communication media including local area networks, the Internet, and digital satellite broadcasting networks.

In this specification, the steps describing the programs stored on the program recording media represent the processes that may be performed parallelly or individually and not chronologically as well as the processes that are to be carried out in the depicted sequence (i.e., on a time series basis).

In this specification, the term "system" refers to an entire configuration made up of a plurality of component devices and apparatuses.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. An encoding method performed by an encoding apparatus for carrying out variable-length conversion encoding involving a look-ahead operation of at least either one information word or one code word upon encoding, said encoding method comprising:

converting an information word to a temporary code word in accordance with a basic code conversion table which has information words associated with temporary code words therein, wherein each information word is converted to a temporary code word such that the maximum transition run of one bits at the beginning and at the end of said temporary code word is limited to two and that the maximum run length of zero bits at the beginning and at the end of said temporary code word is limited to between four and ten; and converting the temporary code word to a code word in accordance with a violation code conversion table constituted by code conversion rules which are prohibited by said basic code conversion table and which are used solely to convert either the temporary code word in effect at present or the temporary code word acquired earlier by said look-ahead operation.

2. The encoding method according to claim 1, further comprising:

converting, in accordance with said violation code conversion table if the maximum run length of zero bits is at least seven at a connection between two temporary code words, selectively one of the two temporary code words of which the run length of zero bits either at the beginning or at the end is at least four, in such a manner that either the first or the last three bits of the selected temporary code word are converted from zero bits to one bits.

3. The encoding method according to claim 2, wherein the code rate of said encoding is 16/17.

4. The encoding method according to claim 2, wherein the code rate of said encoding is 24/25.

5. An encoding apparatus for carrying out variable-length conversion encoding involving a look-ahead operation of at least either one information word or one code word upon encoding, said encoding apparatus comprising:

first converting means for converting, in accordance with a basic code conversion table which has information words associated with temporary code words therein, each information word to a temporary code word such that the maximum transition run of one bits at the beginning and at the end of said temporary code word is limited to two and that the maximum run length of zero bits at the beginning and at the end of said temporary code word is limited to between four and ten; and second converting means for converting, in accordance with a violation code conversion table if the maximum run length of zero bits is at least seven at a connection between two temporary code words, selectively one of the two temporary code words of which the run length of zero bits either at the beginning or at the end is at least four, in such a manner that either the first or the last three bits of the selected temporary code word are converted from zero bits to one bits, said violation code conversion table being constituted by code conversion rules which are prohibited by said basic code conversion table and which are used solely to convert either the temporary code word in effect at present or the temporary code word acquired earlier by said look-ahead operation.

6. The encoding apparatus according to claim 5, wherein the code rate of said encoding is 16/17.

7. The encoding apparatus according to claim 5, wherein the code rate of said encoding is 24/25.

8. A decoding method performed by a decoding apparatus for decoding code words encoded through variable-length conversion encoding involving a look-ahead operation of at least either one information word or one code word upon encoding, said decoding method comprising:

converting a code word to a temporary code word in accordance with a violation code conversion table constituted by code conversion rules which are prohibited by a basic code conversion table having information words associated with temporary code words therein and which permit conversion in units of a code word; and converting said temporary code word to an information word in accordance with said basic rule conversion table whereby the maximum transition run of one bits at the beginning and at the end of said temporary code word is limited to two and whereby the maximum run length of zero bits at the beginning and at the end of said temporary code word is limited to between four and ten.

9. The decoding method according to claim 8, further comprising:

if the transition run of one bits either at the beginning or at the end of said code word is three, then converting either the first or the last three bits of said code word from one bits to zero bits in accordance with said violation code conversion table.

10. The decoding method according to claim 9, wherein the code rate of said encoding is 16/17.

11. The decoding method according to claim 9, wherein the code rate of said encoding is 24/25.

12. A decoding apparatus for decoding code words encoded through variable-length conversion encoding involving a look-ahead operation of at least either one information word or one code word upon encoding, said decoding apparatus comprising:

first decoding means for, if the transition run of one bits either at the beginning or at the end of said code word is three, converting either the first or the last three bits of said code word from one bits to zero bits in accordance with a violation code conversion table constituted by code conversion rules which are prohibited by a basic code conversion table having information words associated with temporary code words therein and which permit conversion in units of a code word; and second decoding means for converting a temporary code word to an information word in accordance with said basic code conversion table whereby the maximum transition run of one bits at the beginning and at the end of said temporary code word is limited to two and whereby the maximum run length of zero bits at the beginning and at the end of said temporary code word is limited to between four and ten.

13. The decoding apparatus according to claim 12, wherein the code rate of said encoding is 16/17.

14. The decoding apparatus according to claim 12, wherein the code rate of said encoding is 24/25.

15. An encoding apparatus for carrying out variable-length conversion encoding involving a look-ahead operation of at least either one information word or one code word upon encoding, said encoding apparatus comprising:

a first converting section configured to convert, in accordance with a basic code conversion table which has information words associated with temporary code words therein, each information word to a temporary code word such that the maximum transition run of one bits at the beginning and at the end of said temporary code word is limited to two and that the maximum run length of zero bits at the beginning and at the end of said temporary code word is limited to between four and ten; and a second converting section configured to convert, in accordance with a violation code conversion table if the maximum run length of zero bits is at least seven at a connection between two temporary code words, selectively one of the two temporary code words of which the run length of zero bits either at the beginning or at the end is at least four, in such a manner that either the first or the last three bits of the selected temporary code word are converted from zero bits to one bits, said violation code conversion table being constituted by code conversion rules which are prohibited by said basic code conversion table and which are used solely to convert either the temporary code word in effect at present or the temporary code word acquired earlier by said look-ahead operation.

16. A decoding apparatus for decoding code words encoded through variable-length conversion encoding involving a look-ahead operation of at least either one information word or one code word upon encoding, said decoding apparatus comprising:

a first decoding section configured, if the transition run of one bits either at the beginning or at the end of said code word is three, to convert either the first or the last three bits of said code word from one bits to zero bits in accordance with a violation code conversion table constituted by code conversion rules which are prohibited by a basic code conversion table having information words associated with temporary code words therein and which permit conversion in units of a code word; and a second decoding section configured to convert a temporary code word to an information word in accordance with said basic code conversion table whereby the maximum transition run of one bits at the beginning and at the end of said temporary code word is limited to two and whereby the maximum run length of zero bits at the beginning and at the end of said temporary code word is limited to between four and ten.

* * * * *